US010228990B2

(12) United States Patent
Song et al.

(10) Patent No.: US 10,228,990 B2
(45) Date of Patent: Mar. 12, 2019

(54) VARIABLE-TERM ERROR METRICS ADJUSTMENT

(71) Applicant: SanDisk Technologies LLC, Plano, TX (US)

(72) Inventors: Yiwei Song, Union City, CA (US); Nian Niles Yang, Mountain View, CA (US); James Fitzpatrick, Sudbury, MA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 276 days.

(21) Appl. No.: 15/195,910

(22) Filed: Jun. 28, 2016

(65) Prior Publication Data
US 2017/0139761 A1 May 18, 2017

Related U.S. Application Data

(60) Provisional application No. 62/254,658, filed on Nov. 12, 2015.

(51) Int. Cl.
*G06F 11/07* (2006.01)
*G06F 12/02* (2006.01)
(Continued)

(52) U.S. Cl.
CPC .......... *G06F 11/073* (2013.01); *G06F 11/076* (2013.01); *G06F 11/0754* (2013.01);
(Continued)

(58) Field of Classification Search
CPC .... G06F 11/073; G06F 11/1008; G06F 12/02; G11C 16/349
See application file for complete search history.

(56) References Cited

U.S. PATENT DOCUMENTS 4,586,167 A  4/1986 Fujishima et al.
5,559,988 A  9/1996 Durante et al.
(Continued)

FOREIGN PATENT DOCUMENTS

EP  0 376 285 A2  7/1990
WO  WO 2012/083308  6/2012

OTHER PUBLICATIONS

Seagate Technology, "SCSI Commands Reference Manual, Rev. C", Product Manual dated Apr. 2010, pp. 211-214.
(Continued)

*Primary Examiner* — Yolanda L Wilson
(74) *Attorney, Agent, or Firm* — Morgan, Lewis & Bockius LLP

(57) ABSTRACT

Systems, methods and/or devices are used to adjust error metrics for a memory portion of non-volatile memory in a storage device. In one aspect, a first write and a first read are performed on the memory portion. In accordance with results of the first read, a first error metric value for the memory portion is determined. In accordance with a determination that the first error metric value exceeds a first threshold value, an entry for the memory portion is added to a table. After the first write, when a second write to the memory portion is performed, it is determined whether the entry for the memory portion is present in the table. In accordance with a determination that the entry for the memory portion is present in the table, the second write uses a first error adjustment characteristic that is determined in accordance with the first error metric value.

20 Claims, 9 Drawing Sheets

(51) Int. Cl.
    *G11C 16/34*     (2006.01)
    *G06F 11/08*     (2006.01)
    *G11C 29/44*     (2006.01)
    *G11C 29/04*     (2006.01)

(52) U.S. Cl.
    CPC .......... *G06F 11/0793* (2013.01); *G06F 11/08* (2013.01); *G06F 12/02* (2013.01); *G11C 16/349* (2013.01); *G11C 29/4401* (2013.01); *G11C 2029/0409* (2013.01); *G11C 2029/0411* (2013.01)

(56) References Cited

U.S. PATENT DOCUMENTS

| | | |
|---|---|---|
| 5,909,559 A | 6/1999 | So |
| 6,247,136 B1 | 6/2001 | MacWilliams et al. |
| 6,292,410 B1 | 9/2001 | Yi et al. |
| 6,401,213 B1 | 6/2002 | Jeddeloh |
| 6,449,709 B1 | 9/2002 | Gates |
| 6,952,682 B1 | 10/2005 | Wellman |
| 7,969,809 B2 | 6/2011 | Ben-Rubi |
| 8,010,738 B1 | 8/2011 | Chilton et al. |
| 8,122,202 B2 | 2/2012 | Gillingham |
| 8,213,255 B2 | 7/2012 | Hemink et al. |
| 8,255,618 B1 | 8/2012 | Borchers et al. |
| 8,266,501 B2 | 9/2012 | Jeddeloh |
| 8,321,627 B1 | 11/2012 | Norrie et al. |
| 8,412,985 B1* | 4/2013 | Bowers ............... G06F 11/1666 714/42 |
| 8,412,987 B2* | 4/2013 | Billing ................ G06F 11/1008 714/710 |
| 8,429,498 B1 | 4/2013 | Anholt et al. |
| 8,473,669 B2 | 6/2013 | Sinclair |
| 8,479,080 B1 | 7/2013 | Shalvi et al. |
| 8,539,139 B1 | 9/2013 | Morris |
| 8,595,590 B1 | 11/2013 | Vojcic et al. |
| 8,775,720 B1 | 7/2014 | Meyer et al. |
| 8,825,967 B2 | 9/2014 | Hong Beom |
| 8,874,836 B1 | 10/2014 | Hayes et al. |
| 8,886,872 B1 | 11/2014 | Norrie |
| 8,924,661 B1 | 12/2014 | Shachar et al. |
| 8,984,376 B1 | 3/2015 | Norrie |
| 9,128,825 B1 | 9/2015 | Albrecht et al. |
| 9,170,876 B1 | 10/2015 | Bates et al. |
| 9,176,971 B2 | 11/2015 | Shapiro |
| 9,214,965 B2 | 12/2015 | Fitzpatrick et al. |
| 9,514,845 B1* | 12/2016 | Wu ........................ G11C 29/42 |
| 9,606,737 B2 | 3/2017 | Kankani et al. |
| 9,639,282 B2 | 5/2017 | Kankani et al. |
| 2003/0115403 A1 | 6/2003 | Bouchard et al. |
| 2003/0122834 A1 | 7/2003 | Mastronarde et al. |
| 2004/0117441 A1 | 6/2004 | Liu et al. |
| 2005/0144361 A1 | 6/2005 | Gonzalez et al. |
| 2005/0248992 A1 | 11/2005 | Hwang et al. |
| 2007/0002629 A1 | 1/2007 | Lee et al. |
| 2007/0156998 A1 | 7/2007 | Gorobets |
| 2007/0233937 A1 | 10/2007 | Coulson et al. |
| 2008/0140914 A1 | 6/2008 | Jeon |
| 2008/0147994 A1 | 6/2008 | Jeong et al. |
| 2008/0235466 A1 | 9/2008 | Traister |
| 2008/0235480 A1 | 9/2008 | Traister |
| 2008/0291204 A1 | 11/2008 | Korupolu et al. |
| 2008/0295094 A1 | 11/2008 | Korupolu et al. |
| 2009/0138654 A1* | 5/2009 | Sutardja ............. G06F 12/0246 711/103 |
| 2009/0168525 A1 | 7/2009 | Olbrich et al. |
| 2009/0177943 A1 | 7/2009 | Silvus et al. |
| 2009/0222627 A1 | 9/2009 | Reid |
| 2009/0282191 A1 | 11/2009 | Depta |
| 2010/0005217 A1 | 1/2010 | Jeddeloh |
| 2010/0014364 A1 | 1/2010 | Laberge et al. |
| 2010/0082879 A1 | 4/2010 | McKean et al. |
| 2010/0165730 A1 | 7/2010 | Sommer et al. |
| 2010/0174845 A1 | 7/2010 | Gorobets et al. |
| 2010/0174853 A1 | 7/2010 | Lee et al. |
| 2010/0220509 A1 | 9/2010 | Solokov et al. |
| 2010/0250874 A1 | 9/2010 | Farrell et al. |
| 2011/0113204 A1 | 5/2011 | Henriksson et al. |
| 2011/0138100 A1 | 6/2011 | Sinclair |
| 2011/0235434 A1 | 9/2011 | Byom et al. |
| 2011/0252215 A1 | 10/2011 | Franceschini et al. |
| 2011/0264851 A1 | 10/2011 | Jeon et al. |
| 2011/0302474 A1 | 12/2011 | Goss et al. |
| 2012/0030408 A1 | 2/2012 | Flynn et al. |
| 2012/0047317 A1 | 2/2012 | Yoon et al. |
| 2012/0159070 A1 | 6/2012 | Baderdinni et al. |
| 2012/0198129 A1 | 8/2012 | Van Aken et al. |
| 2012/0224425 A1 | 9/2012 | Fai et al. |
| 2012/0278530 A1 | 11/2012 | Ebsen |
| 2012/0324180 A1 | 12/2012 | Asnaashari et al. |
| 2013/0007380 A1 | 1/2013 | Seekins et al. |
| 2013/0070507 A1 | 3/2013 | Yoon |
| 2013/0070525 A1* | 3/2013 | Shimura ............. G11C 11/5628 365/185.03 |
| 2013/0111112 A1 | 5/2013 | Jeong et al. |
| 2013/0111289 A1 | 5/2013 | Zhang et al. |
| 2013/0111290 A1 | 5/2013 | Zhang et al. |
| 2013/0132650 A1 | 5/2013 | Choi et al. |
| 2013/0166949 A1* | 6/2013 | Um ..................... G06F 11/0793 714/15 |
| 2013/0182506 A1 | 7/2013 | Melik-Martirosian |
| 2013/0219106 A1 | 8/2013 | Vogan et al. |
| 2013/0232290 A1 | 9/2013 | Ish et al. |
| 2013/0254498 A1 | 9/2013 | Adachi et al. |
| 2013/0262745 A1 | 10/2013 | Lin et al. |
| 2013/0297894 A1 | 11/2013 | Cohen et al. |
| 2013/0346805 A1 | 12/2013 | Sprouse et al. |
| 2014/0006688 A1 | 1/2014 | Yu et al. |
| 2014/0013026 A1 | 1/2014 | Venkata et al. |
| 2014/0047170 A1 | 2/2014 | Cohen et al. |
| 2014/0075100 A1 | 3/2014 | Kaneko et al. |
| 2014/0143637 A1 | 5/2014 | Cohen et al. |
| 2014/0148175 A1 | 5/2014 | Luo |
| 2014/0173239 A1 | 6/2014 | Schushan |
| 2014/0229655 A1 | 8/2014 | Goss et al. |
| 2014/0229656 A1 | 8/2014 | Goss et al. |
| 2014/0241071 A1 | 8/2014 | Goss et al. |
| 2014/0244897 A1 | 8/2014 | Goss et al. |
| 2014/0244899 A1 | 8/2014 | Schmier et al. |
| 2014/0258598 A1 | 9/2014 | Canepa et al. |
| 2014/0281833 A1 | 9/2014 | Kroeger et al. |
| 2014/0310241 A1 | 10/2014 | Goyen |
| 2014/0379988 A1 | 12/2014 | Lyakhovitskiy et al. |
| 2015/0033064 A1* | 1/2015 | Davis ................ G11C 29/4401 714/6.11 |
| 2015/0067172 A1 | 3/2015 | Ashokan et al. |
| 2015/0074487 A1 | 3/2015 | Patapoutian et al. |
| 2015/0095558 A1 | 4/2015 | Kim et al. |
| 2015/0113206 A1 | 4/2015 | Fitzpatrick et al. |
| 2015/0186278 A1 | 7/2015 | Jayakumar et al. |
| 2015/0234612 A1 | 8/2015 | Himelstein et al. |
| 2015/0261473 A1 | 9/2015 | Matsuyama et al. |
| 2015/0262632 A1 | 9/2015 | Shelton et al. |
| 2015/0293720 A1* | 10/2015 | Lam ..................... G06F 9/5016 711/147 |
| 2015/0301749 A1 | 10/2015 | Seo et al. |
| 2015/0324148 A1* | 11/2015 | Achtenberg ........ G06F 11/1012 711/103 |
| 2015/0331627 A1 | 11/2015 | Kwak |
| 2016/0026386 A1 | 1/2016 | Ellis et al. |
| 2016/0034194 A1 | 2/2016 | Brokhman et al. |
| 2016/0062699 A1 | 3/2016 | Samuels et al. |
| 2016/0070493 A1 | 3/2016 | Oh et al. |
| 2016/0071612 A1 | 3/2016 | Takizawa et al. |
| 2016/0117099 A1 | 4/2016 | Prins et al. |
| 2016/0117102 A1 | 4/2016 | Hong et al. |
| 2016/0117105 A1 | 4/2016 | Thangaraj et al. |
| 2016/0117252 A1 | 4/2016 | Thangaraj et al. |
| 2016/0170671 A1 | 6/2016 | Huang |
| 2016/0170831 A1 | 6/2016 | Lesatre et al. |
| 2016/0179403 A1 | 6/2016 | Kurotsuchi et al. |
| 2016/0210060 A1 | 7/2016 | Dreyer |
| 2016/0299689 A1 | 10/2016 | Kim et al. |

(56) References Cited

U.S. PATENT DOCUMENTS

| | | |
|---|---|---|
| 2016/0299699 A1 | 10/2016 | Vanaraj et al. |
| 2016/0299704 A1 | 10/2016 | Vanaraj et al. |
| 2016/0299724 A1 | 10/2016 | Vanaraj et al. |
| 2016/0342344 A1 | 11/2016 | Kankani et al. |
| 2016/0342345 A1 | 11/2016 | Kankani et al. |
| 2016/0371394 A1 | 12/2016 | Shahidi et al. |
| 2018/0136850 A1* | 5/2018 | Ignomirello .......... G06F 3/0608 |

OTHER PUBLICATIONS

Tanenbaum, "Structured Computer Organization", 3rd edition 1990, section 1.4, p. 11, 3 pages.

International Search Report and Written Opinion dated Nov. 18, 2015, received in International Patent Application No. PCT/US2015/039552 which corresponds to U.S. Appl. No. 14/559,183, 11 pages (Ellis).

International Search Report and Written Opinion dated Jul. 4, 2016, received in International Patent Application No. PCT/US2016/028477, which corresponds to U.S. Appl. No. 14/883,540, 11 pages (Hodgdon).

International Search Report and Written Opinion dated Nov. 9, 2015, received in International Patent Application No. PCT/US2015/053551, which corresponds to U.S. Appl. No. 14/668,690, 12 pages (Thangaraj).

International Search Report and Written Opinion dated Nov. 11, 2015, received in International Patent Application No. PCT/US2015/053582, which corresponds to U.S. Appl. No. 14/659,493, 12 pages (Prins).

International Search Report and Written Opinion dated Sep. 8, 2016, received in International Patent Application No. PCT/US2016/036716, which corresponds to U.S. Appl. No. 14/925,945, 13 pages (Ellis).

Atmel Data-sheet, "9-to-bit Selectable, ±0.5°C Accurate Digital Temperature Sensor with Nonvolatile Registers and Serial EEPROM" www.atmel.com/images/Atmel-8854-DTS-AT3OTSE752A-754A-758A-Datasheet.pdf, Atmel Data-sheet, Mar 1, 2011,—Atmel-8854-DTS-AT3OTSE752A-754A-758A-Datasheet_102014, 57 pages.

International Preliminary Report on Patentability dated May 2, 2017, received in International Patent Application No. PCT/US2015/053551, which corresponds to U.S. Appl. No. 14/668,690, 8 pages (Thangaraj).

International Preliminary Report on Patentability dated May 2, 2017, received in International Patent Application No. PCT/US2015/053582, which corresponds to U.S. Appl. No. 14/659,493, 7 pages (PRINS).

Office Action dated Apr. 4, 2018, received in Chinese Patent Application No. 201510666998.3, which corresponds to U.S. Appl. No. 14/677,662, 10 pages.

\* cited by examiner

Error Adjustment Characteristics Table 500

| Die | Block | Wordline | Sector | BER |
|---|---|---|---|---|
| 7 | 1039 | 13 | 11 | 0.0104 |
| 5 | 293 | 23 | 5 | 0.0099 |
| 2 | 1151 | 5 | 19 | 0.012 |
| 13 | 307 | 47 | 3 | 0.028 |
| ... | ... | ... | ... | ... |

Determine whether the first error metric value exceeds a second threshold value. In accordance with a determination that the first error metric value exceeds the second threshold value, write the data of the first write to an alternative memory portion that is distinct from the memory portion. ~630

The entry added to the error adjustment characteristics table includes the first error adjustment characteristic. In accordance with a determination that the second error metric exceeds the first threshold value, the entry is updated to replace the first error adjustment characteristic with a second error adjustment characteristic. ~632

The entry added to the error adjustment characteristics table includes the first error metric value. In accordance with a determination that the second error metric exceeds the first threshold value, the entry is updated to replace the first error metric value with the second error metric value. ~634

The storage device comprises one or more three-dimensional (3D) memory devices and circuitry associated with operation of memory elements in the one or more 3D memory devices ~636

The circuity and one or more memory elements in a respective 3D memory device, of the one or more 3D memory devices, are on the same substrate ~638

Figure 6C

VARIABLE-TERM ERROR METRICS ADJUSTMENT

RELATED APPLICATIONS

This application claims priority to U.S. Provisional Patent Application No. 62/254,658, filed Nov. 12, 2015, which is hereby incorporated by reference in its entirety.

TECHNICAL FIELD

The disclosed embodiments relate generally to memory systems, and in particular, to adjusting error metrics for a memory portion of a storage device.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater storage density, so that specifications such as power consumption and form factor may be maintained and preferably reduced. As such, there is ongoing pressure to increase the storage density of non-volatile memories in order to further improve the useful attributes of such devices. However, a drawback of increasing storage density is that the stored data is increasingly prone to storage and/or reading errors.

Error correction schemes have been used to limit the increased likelihood of errors in memory systems. Adjustment of error correction properties responsive to determined error characteristics of memory portions can further improve error correction performance. However, various such adjustments reduce storage capacity. Improvements to error correction adjustment analysis are desirable for reducing the impact of error correction measures on storage capacity.

SUMMARY

Without limiting the scope of the appended claims, after considering this disclosure, and particularly after considering the section entitled "Detailed Description" one will understand how the aspects of various embodiments are used to adjust error metrics for a memory portion of non-volatile memory in a storage device. In particular, a first write to the memory portion is performed, a first read on the memory portion is performed, and in accordance with results of the performed first read, a first error metric value is determined for the memory portion. In accordance with a determination that the first error metric value exceeds the first threshold value, an entry for the memory portion is added to an error adjustment characteristics table. In some embodiments, the entry includes identifying information for the memory portion. When performing a second write to the memory segment, it is determined whether the entry for the memory portion is present in the error adjustment characteristics table, and, in accordance with a determination that the entry for the memory portion is present in the error adjustment characteristics table, the second write is performed using a first error adjustment characteristic, which is determined in accordance with the first error metric value. In some aspects, a second read is performed on the memory portion, and, in accordance with results of the performed second read, a second error metric value is determined for the for the memory portion. If the second error metric value does not exceed the first threshold value, the entry for the memory portion is removed from the error adjustment characteristics table.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIG. 5A illustrates an error adjustment characteristics table, in accordance with some embodiments.

FIGS. 6A-6C illustrate a flowchart representation of a method for adjusting error metrics for a memory portion of non-volatile memory in a storage device, in accordance with some embodiments.

Figure 1:
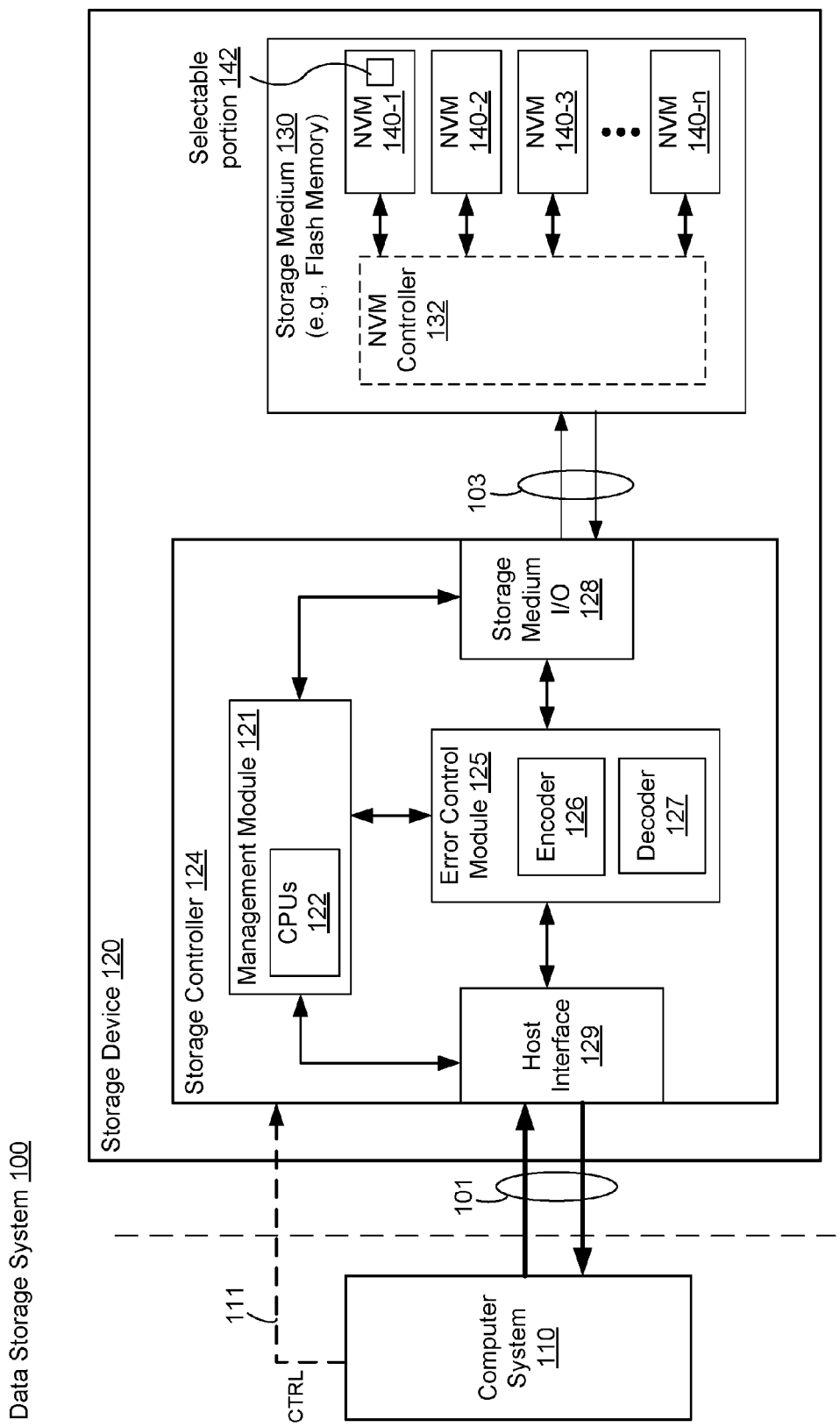
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices used to determine an adjustment for error metrics for a memory portion of non-volatile memory in a storage device.

(A1) More specifically, some embodiments include a method for adjusting error metrics for a memory portion of non-volatile memory in a storage device, the non-volatile memory of the storage device having a plurality of distinct memory portions, including: performing a first write to the memory portion; performing a first read on the memory portion; in accordance with results of the performed first read, determining a first error metric value for the memory portion; determining whether the first error metric value exceeds a first threshold value; in accordance with a determination that the first error metric value exceeds the first threshold value, adding an entry for the memory portion to an error adjustment characteristics table; determining, when performing a second write to the memory portion, whether the entry for the memory portion is present in the error adjustment characteristics table, wherein the second write occurs after the first write; in accordance with a determination that the entry for the memory portion is present in the error adjustment characteristics table, performing the second write using a first error adjustment characteristic, wherein the first error adjustment characteristic is determined in accordance with the first error metric value. In some embodiments, the entry added to the error adjustment characteristics table for the memory portion includes identifying information for the memory portion.

(A2) In some embodiments of the method of A1, the method for adjusting error metrics for a memory portion of non-volatile memory in a storage device further includes: performing a second read on the memory portion; in accordance with results of the performed second read, determining a second error metric value for the memory portion; determining whether the second error metric value exceeds the first threshold value; in accordance with a determination that the second error metric value does not exceed the first threshold value, removing the entry for the memory portion from the error adjustment characteristics table.

(A3) In some embodiments of the method of A2, the entry added to the error adjustment characteristics table includes the first error adjustment characteristic; and the method for adjusting error metrics for a memory portion of non-volatile memory in a storage device further includes, in accordance with a determination that the second error metric exceeds the first threshold value, updating the entry to replace the first error adjustment characteristic with a second error adjustment characteristic.

(A4) In some embodiments of the method of A2, the entry added to the error adjustment characteristics table further includes the first error metric value; and the method for adjusting error metrics for a memory portion of non-volatile memory in a storage device further includes, in accordance with a determination that the second error metric exceeds the first threshold value, updating the entry to replace the first error metric value with the second error metric value.

(A5) In some embodiments of the method of any of A1-A4, the method for adjusting error metrics for a memory portion of non-volatile memory in a storage device further includes: determining whether the first error metric value exceeds a second threshold value; and, in accordance with a determination that the first error metric value exceeds the second threshold value, write the data of the first write to an alternative memory portion that is distinct from the memory portion.

(A6) In some embodiments of the method of any of A1-A5, the first error adjustment characteristic includes an increased number of parity bits used for the second write that is greater than a first number of parity bits used for the first write.

(A7) In some embodiments of the method of any of A1-A6, the first error adjustment characteristic includes an adjusted write voltage level for the second write that is different from a first voltage level used for the first write.

(A8) In some embodiments of the method of any of A1-A7, the first error adjustment characteristic includes padding data for the second write.

(A9) In some embodiments of the method of any of A1-A8, the storage device comprises one or more three-dimensional (3D) memory devices and circuitry associated with operation of memory elements in the one or more 3D memory devices.

(A10) In some embodiments of the method of A9, the circuitry and one or more memory elements in a respective 3D memory device, of the one or more 3D memory devices, are on the same substrate.

(A11) In another aspect, a storage device includes (1) non-volatile memory, (2) one or more processors, and (3) controller memory (e.g., a non-transitory computer readable storage medium in the storage device) storing one or more programs, which when executed by the one or more processors cause the storage device to perform or control performance of any of the methods A1-A10 described herein.

(A12) In yet another aspect, any of the methods A1-A10 described above are performed by a storage device including means for performing any of the methods described herein.

(A13) In yet another aspect, some embodiments include a non-transitory computer readable storage medium, storing one or more programs configured for execution by one or more processors of a storage device, the one or more programs including instructions for performing any of the methods A1-A10 described herein.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure pertinent aspects of the embodiments described herein.

FIG. 1 is a block diagram illustrating an implementation of a data storage system 100, in accordance with some embodiments. While some example features are illustrated, various other features have not been illustrated for the sake of brevity and so as not to obscure pertinent aspects of the example embodiments disclosed herein. To that end, as a non-limiting example, data storage system 100 includes a storage device 120, which includes a storage controller 124 and storage medium 130. Data storage system 100 is used in conjunction with or is embedded in a computer system 110. Storage medium 130 includes one or more NVM devices 140 and optionally includes NVM controller 132. In some embodiments, NVM devices 140 comprise a single flash memory device while in other embodiments NVM devices 140 include a plurality of flash memory devices. In some embodiments, NVM devices 140 are NAND-type flash memory or NOR-type flash memory. In some embodiments, NVM devices 140 include one or more three-dimensional (3D) memory devices, as further defined herein. Further, in some embodiments, storage controller 124 is a solid-state drive (SSD) controller. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels or the like. In some embodiments, data storage system 100 includes one or more storage devices 120.

Computer system 110 is coupled to storage controller 124 through data connections 101, and optionally through a control bus or connection 111 as well. However, in some embodiments computer system 110 includes storage controller 124, or a portion of storage controller 124, as a component and/or a subsystem. For example, in some embodiments, some or all of the functionality of storage controller 124 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch screen display, a mouse, a track-pad, a digital camera and/or any number of supplemental devices to add functionality. In some embodiments, computer system 110 does not have a display and other user interface components.

In some implementations, storage device 120 includes NVM devices 140 such as flash memory devices (e.g., NVM devices 140-1 through 140-n). The NVM devices of storage device 120 are sometimes collectively referred to as storage medium 130. In some embodiments storage device 120 includes NVM controller 132 (sometimes called a memory channel controller or port controller) coupled between storage controller 124 and NVM devices 140. Alternatively, in some embodiments, storage device 120 does not include NVM controllers 132, and instead storage controller 124 handles functions such as host command parsing and logical to physical address translation, and also manages the NVM devices 140, including distributing individual memory operations (e.g. read, write, and erase) to the NVM devices 140.

Storage medium 130 is coupled to storage controller 124 through connections 103. Connections 103 are sometimes called data connections, but typically convey commands in addition to data, and optionally convey metadata, error correction information and/or other information in addition to data values to be stored in NVM devices 140 and data values read from NVM devices 140. In some embodiments, however, storage controller 124 and NVM devices 140 are included in the same device (i.e., an integral device) as components thereof. Furthermore, in some embodiments, storage controller 124 and NVM devices 140 are embedded in a host device (e.g., computer system 110), such as a mobile device, tablet, other computer or computer controlled device, and the methods described herein are performed, at least in part, by the embedded memory controller.

Flash memory device(s) (e.g., storage device 120) can be configured for enterprise storage suitable for applications such as cloud computing, for database applications, primary and/or secondary storage, or for caching data stored (or to be stored) in secondary storage, such as hard disk drives. Additionally and/or alternatively, flash memory device(s) can also be configured for relatively smaller-scale applications such as personal flash drives or hard-disk replacements for personal, laptop, and tablet computers.

NVM devices 140 are divided into a number of addressable and individually selectable blocks. In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line (sometimes spelled "word-line") is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device. The number of pages included in each block varies from one implementation to another; examples are 64, 128 and 256 pages, but other numbers of pages per block are suitable in some implementations. A selectable portion 142 of storage medium 130 is, in various embodiments, a respective NVM 140, a block of a respective NVM 140, a page, word line, sector, or other portion of storage medium 130.

As noted above, while data storage densities of non-volatile semiconductor memory devices are generally increasing, a drawback of increasing storage density is that data is more prone to being stored and/or read erroneously in such devices. In some embodiments, error control coding can be utilized to limit the number of uncorrectable errors that are introduced by electrical fluctuations, defects in the storage medium, operating conditions, device history, write-read circuitry, etc., or a combination of these and various other factors.

In some embodiments, storage controller 124 includes a management module 121, a host interface 129, a storage medium I/O interface 128, and error control module 125. Storage controller 124 may include various additional features that have not been illustrated for the sake of brevity and so as not to obscure pertinent features of the example embodiments disclosed herein, and a different arrangement of features may be possible. Host interface 129 provides an interface to computer system 110 through data connections 101. Similarly, storage medium I/O 128 provides an interface to storage medium 130 though connections 103. In some embodiments, storage medium I/O interface 128 includes transmit and receive circuitry, including circuitry capable of providing reading signals to storage medium 130 (e.g., reading threshold voltages for NAND-type flash memory).

In some embodiments, management module 121 includes one or more processing units (CPUs, also sometimes called processors, or hardware processors, and sometimes implemented using microprocessors, microcontrollers, or the like) 122 configured to execute instructions in one or more programs (e.g., in management module 121). In some embodiments, the one or more CPUs 122 are shared by one or more components within, and in some cases, beyond the function of storage controller 124. Management module 121 is coupled to host interface 129, error control module 125 and storage medium I/O interface 128 in order to coordinate the operation of these components. In some embodiments, one or more modules of management module 121 are implemented in a management module of computer system 110 (not shown). In some embodiments, one or more processors of computer system 110 (not shown) are configured to execute instructions in one or more programs (e.g., in a management module of computer system 110).

Error control module 125 is coupled to storage medium I/O 128, host interface 129, and management module 121. As an example, error control module 125 is used to limit the number of uncorrectable errors inadvertently introduced into data during writes to memory or reads from memory. In some embodiments, error control module 125 is executed in software by the one or more CPUs 122 of management module 121, and, in other embodiments, error control module 125 is implemented in whole or in part using special purpose circuitry (e.g., to perform encoding and decoding functions). In some embodiments, error control module 125 is implemented in whole or in part by software executed on computer system 110.

In some embodiments, error control module 125 includes encoder 126 and decoder 127. In some embodiments, encoder 126 encodes data by applying an error control code (ECC) to produce a codeword, which is subsequently stored in one or more NVM devices 140 of storage medium 130. Codewords produced by the encoder include both data (sometimes herein called the encoded data) and corresponding error correction bits (sometimes called parity values, parity bits, or syndrome values). Furthermore, as described in greater detail below, encoders can be configured to produce codewords having a particular code rate (e.g., ratio of data bits in a codeword to the size of the codeword) and codeword structure (e.g., length, in bits, of the codeword; optionally, the codeword structure also includes information about where, within the codeword, the error correction bits are located). When the encoded data (e.g., one or more codewords) is read from NVM devices 140, the decoder applies a decoding process to the encoded data to recover the data, and to correct errors in the recovered data within the error correcting capability of the error control code.

Types of error correction codes include, for example, Hamming, Reed-Solomon (RS), Bose Chaudhuri Hocquenghem (BCH), and low-density parity-check (LDPC). Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type, class, or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

In some embodiments, encoder 126 includes a plurality of encoders configured to encode data in accordance with one or more error correction formats (e.g., corresponding to a particular code rate, codeword structure, and error correction type, as described in greater detail below), and decoder 127 includes a plurality of decoders configured to decode data in accordance with one or more error correction formats. Furthermore, in some implementations, each of the plurality of encoders and/or decoders are configured to encode/decode data in accordance with distinct error correction formats (e.g., encoder 126 includes a BCH encoder and an LDPC encoder).

In some embodiments, during a write operation, host interface 129 receives data to be stored in one or more NVM devices 140 from computer system 110. The data received by host interface 129 is made available to an encoder (e.g., encoder 126), which encodes the data to produce one or more codewords. The one or more codewords are made available to storage medium I/O 128, which transfers the one or more codewords to one or more storage media 130 for storage in one or more NVM devices 140, in a manner dependent on the type of storage medium being utilized.

In some embodiments, a read operation is initiated when computer system (host) 110 sends one or more host read commands (e.g., via data connections 101, or alternatively a separate control line or bus) to storage controller 124 requesting data from NVM devices 140. Storage controller 124 sends one or more read access commands to storage medium 130 (e.g., one or more NVM devices 140) via storage medium I/O interface 128, to obtain raw read data in accordance with memory locations (physical addresses), specified, directly or indirectly, by the one or more host read commands. Storage medium I/O interface 128 provides the raw read data (e.g., comprising one or more codewords) to a decoder (e.g., decoder 127). If the decoding is successful, the decoded data is provided to host interface 129, where the decoded data is made available to computer system 110. In some embodiments, if the decoding is not successful, storage controller 124 may resort to a number of remedial actions or provide an indication of an irresolvable error condition.

As explained above, NVM devices 140 are divided into a number of addressable and individually selectable blocks and each block is optionally (but typically) further divided into a plurality of pages and/or word lines and/or sectors. While erasure of non-volatile memory devices is performed on a block basis, in many embodiments, reading and programming of non-volatile memory devices is performed on a smaller subunit of a block (e.g., on a page basis, word line basis, or sector basis). In some embodiments, the smaller subunit of a block consists of multiple memory cells (e.g., single-level cells or multi-level cells). In some embodiments, programming is performed on an entire page. In some embodiments, a multi-level cell (MLC) NAND flash typically has four possible states per cell, yielding two bits of information per cell. Further, in some embodiments, a MLC NAND has two page types: (1) a lower page (sometimes called fast page), and (2) an upper page (sometimes called slow page). In some embodiments, a triple-level cell (TLC) NAND flash has eight possible states per cell, yielding three bits of information per cell. Although the description herein uses TLC, MLC, and SLC as examples, those skilled in the art will appreciate that the embodiments described herein may be extended to memory cells that have more than eight possible states per cell, yielding more than three bits of information per cell.

The encoding format of the storage media (i.e., TLC, MLC, or SLC and/or a chosen data redundancy mechanism) is a choice made when data is actually written to the storage media. In this specification there are described events, conditions, or processes that are said to set the encoding format, alter the encoding format of the storage media, etc. It should be recognized that the actual process may involve multiple steps, e.g., erasure of the previous contents of the storage media followed by the data being written using the new encoding format and that these operations may be separated in time from the initiating event, condition or procedure.

Figure 2:
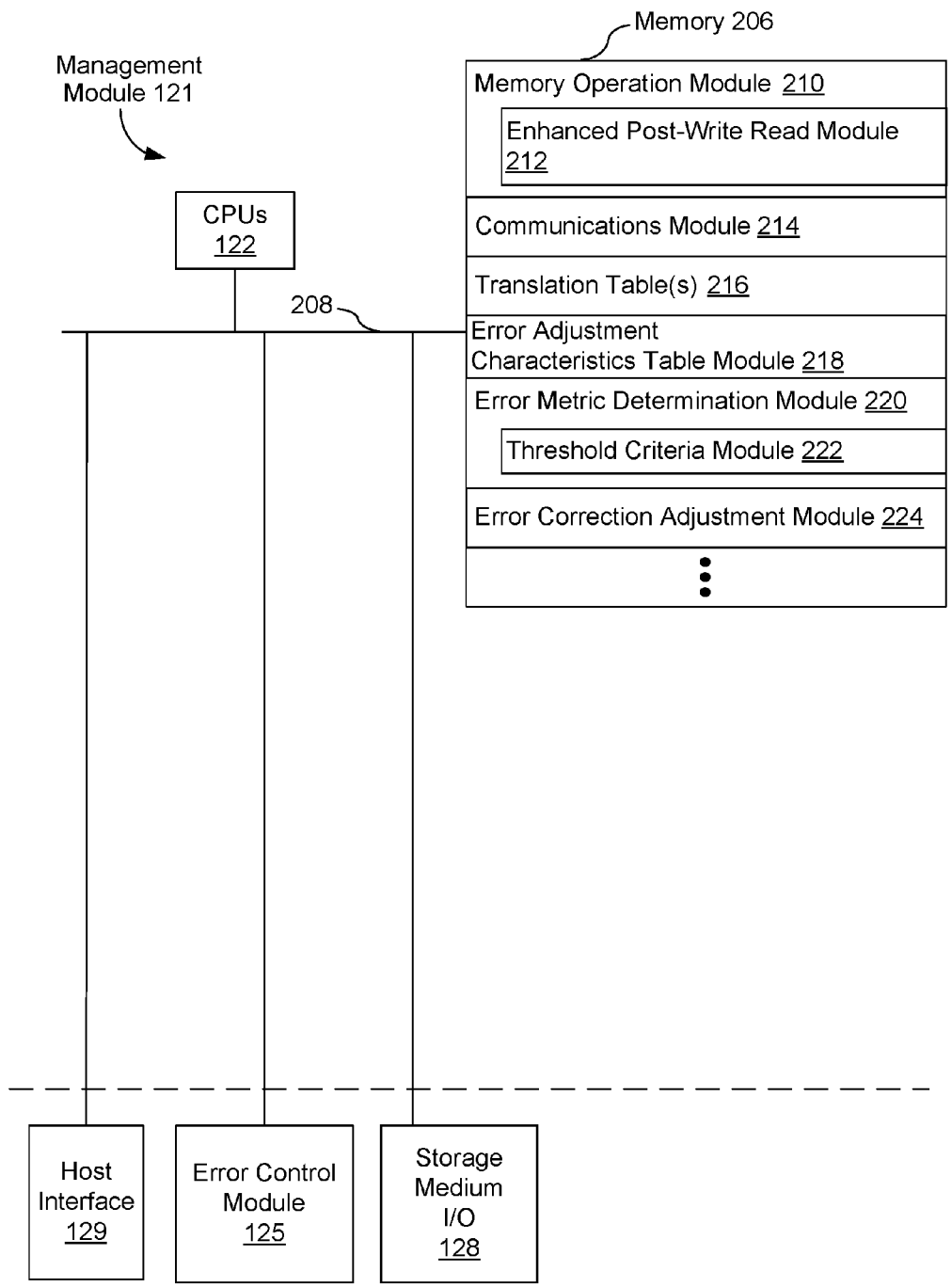
FIG. 2 is a block diagram illustrating an implementation of a management module, in accordance with some embodiments.

FIG. 2 is a block diagram illustrating an implementation of a management module 121, in accordance with some embodiments. Management module 121 typically includes one or more CPUs 122 (also sometimes called processors, processing units, microprocessors or microcontrollers) for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from CPUs 122. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:

- a memory operation module 210 for dispatching commands corresponding to read, write and/or erase operations for reading data from, writing data to, or erasing data from NVM devices 140; in some implementations memory operation module 210 dispatches commands to NVM controller 132, which in turn dispatches the commands to NVM devices 140;
- an enhanced post-write read module 212 that is used for reading data from a selectable portion 142 of storage medium 130 after data was written to the selectable portion 142 to verify that the data was written successfully;
- a communications module 214 that is used for communicating with other computer systems or computer components (e.g., via host interface 129 and/or storage medium I/O);
- translation table(s) 216 for mapping logical addresses (e.g., of logical groups of data) to physical addresses (e.g., physical locations of memory portions);
- an error adjustment characteristics table module 218 for storing one or more error adjustment characteristics tables (e.g., error adjustment characteristics table 500 as described below with reference to FIG. 5A and error adjustment characteristics table 550 as described below with reference to 5B); and for inserting entries into and/or modifying error adjustment characteristics tables; and
- an error metric determination module 220 for measuring (e.g., by error control module 125) or otherwise obtaining a performance metric (e.g., bit error rate) for memory portions of non-volatile memory (e.g., selectable portion 142);
- a threshold criteria module 222 for maintaining and/or defining one or more performance thresholds (e.g., a threshold bit error rate, such as an uncorrectable error rate), and determining whether measured performance metrics satisfy the one or more performance thresholds; and
- an error correction adjustment module 224 for maintaining, defining, and/or modifying error adjustment characteristics (e.g., adding, removing, and adjusting adjustment characteristic entries in error adjustment characteristics table 218) for memory portion 142 of storage medium 130.

In some embodiments, a write to a portion of memory (e.g., selectable portion 142 of NVM 140-1, as indicated in FIG. 1) is performed by memory operation module 210. After the write is performed, a read is performed by enhanced post-write read module 212 on the memory portion 142, and an error metric value (e.g., BER) is determined by error metric determination module 220 based on the results of the read. If the error metric value exceeds a threshold value (e.g., as determined by threshold criteria module 222), an entry for the memory portion is inserted into an error adjustment characteristics table (e.g., table 500, FIG. 5A) by error adjustment characteristics table module 218. When a subsequent write to the same memory portion occurs (e.g., a subsequent write to memory portion 142), if the entry for the memory portion is present in the error adjustment characteristics table (e.g., as determined by error adjustment characteristics table module 218), the write is performed using an error adjustment characteristic (e.g., as determined by error correction adjustment module 224). The error adjustment characteristic includes one or more techniques for avoiding future errors, such as increasing the number of parity bits used for the write to selectable portion 142, adjusting the write voltage level used for the write, and/or using padding data in lieu of the data of the write. In some embodiments, a read is performed by enhanced post-write read module 212 after the subsequent write is performed and a new error metric value is determined by error metric determination module 220 based on the read. If the new error metric value does not exceed the threshold value (e.g., the same threshold value used to determine the original error metric value), the entry for the memory portion is removed from the error adjustment characteristics table by error adjustment characteristics table module 218. In this way, a device uses error adjustment techniques for writes to a memory portion when the memory portion exhibits erroneous behavior (as indicated by the presence of an entry for the memory portion in an error adjustment characteristics table) and the device ceases to use the error adjustment techniques when the erroneous behavior is no longer exhibited by the memory portion (as indicated by the absence of an entry for the memory portion in an error adjustment characteristics table).

Each of the above identified elements (e.g., modules 210, 212, 214, 220, 222, 224 and table(s) 216, 218) may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing respective operations in the methods described below. In some embodiments, some or all of these modules may be implemented with specialized hardware circuits that subsume part or all of the module functionality.

Although FIG. 2 shows management module 121, FIG. 2 is intended more as a functional description of the various features which may be present in a management module than as a structural schematic of the embodiments described herein. In practice, and as recognized by those of ordinary skill in the art, items shown separately could be combined and some items could be separated. Further, although FIG. 2 shows management module 121 of storage controller 124, in embodiments that include NVM controllers (e.g., NVM controller 132) in storage device 120 (FIG. 1), some of the functions shown in FIG. 2 as being implemented in management module 121 may instead be implemented, in whole or in part, in management modules (not shown) of the NVM controllers.

Flash memory devices utilize memory cells to store data as electrical values, such as electrical charges or voltages.

Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage, is used to represent one or more data values. In some embodiments, during a read operation, a reading threshold voltage is applied to the control gate of the transistor and the resulting sensed current or voltage is mapped to a data value.

The terms "cell voltage" and "memory cell voltage," in the context of flash memory cells, typically means the threshold voltage of the memory cell, which is the minimum voltage that needs to be applied to the gate of the memory cell's transistor in order for the transistor to conduct current. Similarly, reading threshold voltages (sometimes also called reading signals, reading voltages, and/or read thresholds) applied to a flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1," and otherwise the raw data value is a "0."

Figure 3A:
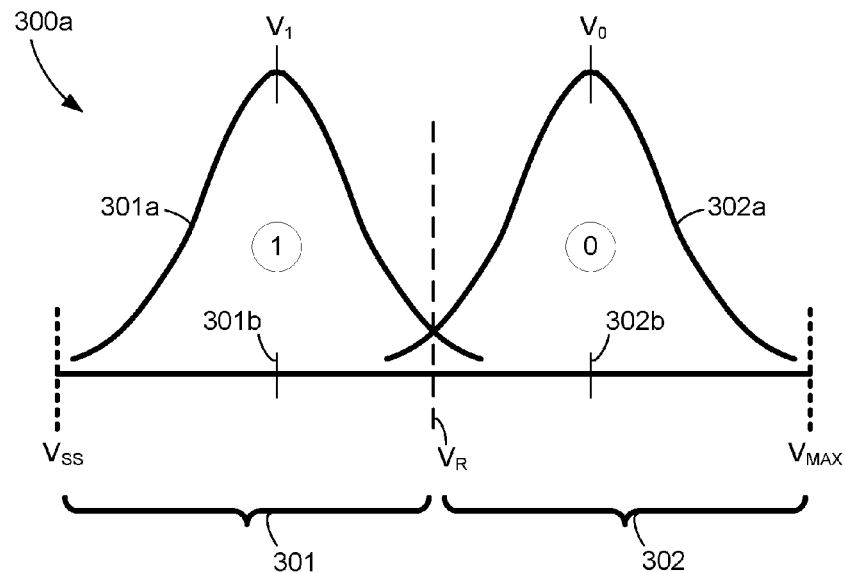
FIG. 3A is a prophetic diagram of voltage distributions that may be found in a single-level flash memory cell (SLC) over time, in accordance with some embodiments.

FIG. 3A is a simplified, prophetic diagram of voltage distributions 300a found in a single-level flash memory cell (SLC) over time, in accordance with some embodiments. The voltage distributions 300a shown in FIG. 3A have been simplified for illustrative purposes. In this example, the SLC's voltage range extends approximately from a first voltage, $V_{SS}$ (e.g., 0 volts), and the maximum allowed gate voltage, $V_{MAX}$ (e.g., 6 volts). As such, voltage distributions 300a extend between $V_{SS}$ and $V_{MAX}$.

Sequential voltage ranges 301 and 302 between voltages $V_{SS}$ and $V_{MAX}$ are used to represent corresponding bit values "1" and "0," respectively. Each voltage range 301, 302 has a respective center voltage $V_1$ 301b, $V_0$ 302b. As described below, in many circumstances the memory cell current sensed in response to an applied reading threshold voltages is indicative of a memory cell voltage different from the respective center voltage $V_1$ 301b or $V_0$ 302b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 301, 302 also has a respective voltage distribution 301a, 302a that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 301b and $V_0$ 302b). Optionally, in some implementations, the reading threshold voltage is located between voltage ranges 301 and 302. In some implementations, reading threshold voltage $V_R$ is applied in the region proximate to where the voltage distributions 301a and 302a overlap, which is not necessarily proximate to the halfway region between adjacent center voltages $V_1$ 301b and $V_0$ 302b.

In order to increase storage density in flash memory, flash memory has developed from single-level (SLC) cell flash memory to multi-level cell (MLC) flash memory so that two or more bits can be stored by each memory cell. As discussed below with reference to FIG. 3B, a MLC flash memory device is used to store multiple bits by using voltage ranges within the total voltage range of the memory cell to represent different bit-tuples. A MLC flash memory device is typically more error-prone than a SLC flash memory device created using the same manufacturing process because the effective voltage difference between the voltages used to store different data values is smaller for a MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below with reference to FIG. 3B, the impact of such errors can be reduced by gray-coding the data, such that adjacent voltage ranges represent single-bit changes between bit-tuples.

Figure 3B:
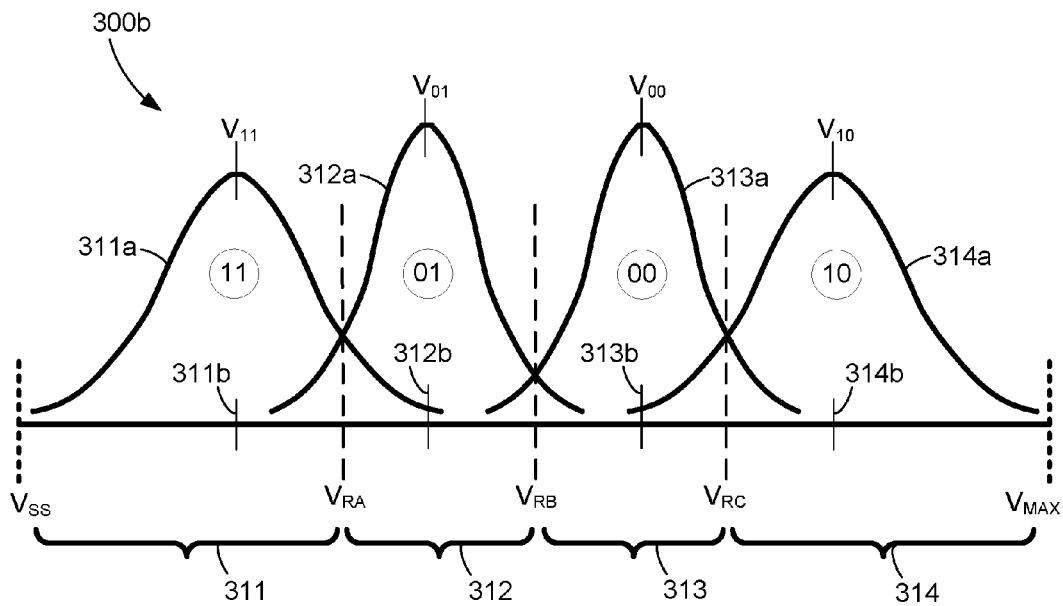
FIG. 3B is a prophetic diagram of voltage distributions that may be found in a multi-level flash memory cell (MLC) over time, in accordance with some embodiments.

FIG. 3B is a simplified, prophetic diagram of voltage distributions 300b found in a multi-level flash memory cell (MLC) over time, in accordance with some embodiments. The voltage distributions 300b shown in FIG. 3B have been simplified for illustrative purposes. The cell voltage of a MLC approximately extends from a first voltage, $V_{SS}$, to a maximum gate voltage, $V_{max}$. As such, voltage distributions 300b extend between $V_{SS}$ and $V_{max}$.

Sequential voltage ranges 311, 312, 313, 314 between voltages $V_{SS}$ and $V_{MAX}$ are used to represent corresponding bit-tuples "11," "01," "00," "10," respectively. Each voltage range 311, 312, 313, 314 has a respective center voltage 311b, 312b, 313b, 314b. Each voltage range 311, 312, 313, 314 also has a respective voltage distribution 311a, 312a, 313a, 314a that may occur as a result of any number of a combination of factors, such as electrical fluctuations, defects in the storage medium, operating conditions, device history (e.g., number of program-erase (PE) cycles), and/or imperfect performance or design of write-read circuitry.

Ideally, during a write operation, the charge on the floating gate of the MLC would be set such that the resultant cell voltage is at the center of one of the ranges 311, 312, 313, 314 in order to write the corresponding bit-tuple to the MLC. Specifically, the resultant cell voltage would be set to one of $V_{11}$ 311b, $V_{01}$ 312b, $V_{00}$ 313b and $V_{10}$ 314b in order to write a corresponding one of the bit-tuples "11," "01," "00" and "10." In reality, due to the factors mentioned above, the initial cell voltage may differ from the center voltage for the data written to the MLC.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 311, 312, 313, 314. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 311b, $V_{01}$ 312b, $V_{00}$ 313b or $V_{10}$ 314b corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

Although the description of FIG. 3B uses an example in which q=2 (i.e., 2 bits per cell in a MLC flash memory), those skilled in the art will appreciate that the embodiments described herein may be extended to memory cells that have more than four possible states per cell, yielding more than two bits of information per cell. For example, in some embodiments, a triple-level memory cell (TLC) has eight possible states per cell, yielding three bits of information per cell (e.g., corresponding to a lower page, a middle page, and an upper page). As another example, in some embodiments, a quad-level memory cell (QLC) has 16 possible states per cell, yielding four bits of information per cell. As another example, in some embodiments, a cell might store only 6 states, yielding approximately 2.5 bits of information per cell, meaning that two cells together would provide 36 possible states, more than sufficient to store 5 bits of information per pair of cells.

Error metric determination module 220, in some embodiments, is used to detect a BER resulting from cell voltage drift in a flash memory device having memory cells configured to operate as SLC, MLC or TLC memory cells. In some embodiments, error metric determination module 220 is used to detect the cell voltage drift or other cause of a BER that exceeds a threshold level.

Various error adjustment techniques are used to reduce the occurrence of errors in a portion 142 of a storage medium 130 (e.g., as indicated by a BER for the portion 142). Some approaches to reducing the occurrence of errors in a portion of a storage medium involve application of error adjustments on a permanent basis. However, after an error adjustment is applied to a memory portion, it is possible that the error adjustment is no longer needed for subsequent memory operations (e.g., because the condition causing of the error is no longer present). In embodiments described herein, error metrics of a memory portion are monitored (e.g., as described below with reference to FIG. 4) and application of error adjustments to the memory portion is modified (e.g., by creating, modifying and removing entries in an error adjustment characteristics table 500 as indicated by FIG. 5A, or by modifying entries in an error adjustment characteristics table 550 as indicated by FIG. 5B) in response to the monitoring. Continuously determining whether error adjustments are needed enables error issues in a memory portion to be addressed without permanently removing the contribution of the memory portion to the available memory of a system.

Figure 4:
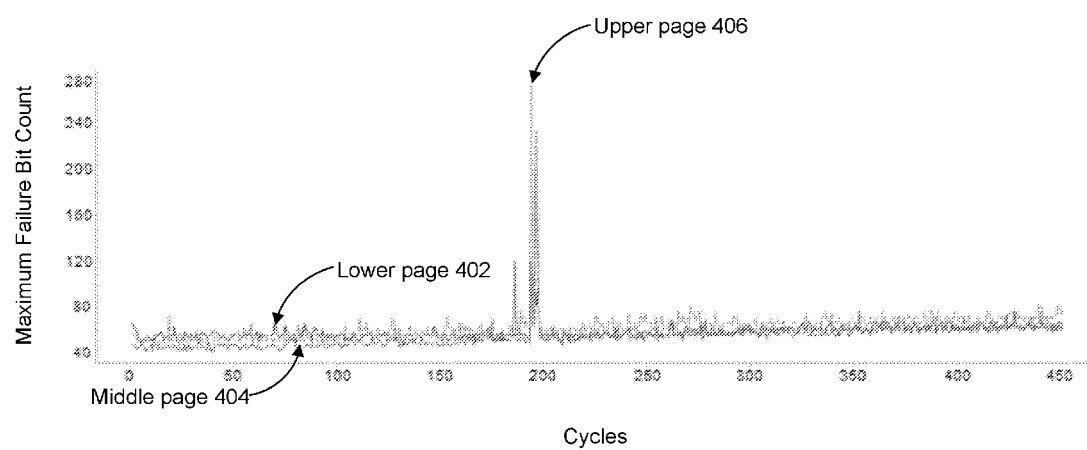
FIG. 4 illustrates experimental data indicating a maximum failure bit count (FBC) for a memory portion versus a number of program/erase cycles, in accordance with some embodiments.
Figure 5B:
FIG. 5B illustrates an error adjustment characteristics table that includes an error count column, in accordance with some embodiments.

FIG. 4 illustrates experimental data indicating a maximum failure bit count (FBC) for a memory portion versus a number of program/erase cycles, in accordance with some embodiments. The three data sets shown in FIG. 4 indicate three page types (e.g., lower page 402, middle page 404, and upper page 406) of a multi-level cell (MLC) block. As illustrated in FIG. 4, the FBC rises significantly for all three page types (402, 404, 406) beginning at approximately 190 cycles. When the FBC is high, an error adjustment is used to mitigate the errors caused by the cell. The FBC for all page types (402, 404, 406) subsequently declines at approximately 200 cycles. When the FBC has decreased, the error adjustment is no longer necessary. Various embodiments described herein are usable to detect (e.g., by error metric determination module 220) increases and subsequent decreases in FBC and modify error adjustments (e.g., by error correction adjustment module 224) accordingly.

FIG. 5A illustrates an error adjustment characteristics table 500 used for determining whether to apply an error adjustment when writing data to (and/or reading data from) a memory portion, in accordance with some embodiments. An error adjustment characteristics table, also referred to herein as a "table," refers to a database table (e.g., as illustrated in FIG. 5A) or another data structure that stores information for at least one memory portion. In some embodiments, the stored information includes identifying information for the memory portion. For example, error adjustment characteristics table 500 includes identifying information for a memory portion (e.g., selectable portion 142 of storage device 130). Identifying information includes, e.g., a die identifier (column 502), a block identifier (column 504), a word line identifier (column 506), a sector identifier (column 508) and/or other information usable to uniquely identify a memory portion. In some embodiments, error adjustment characteristics table 500 includes an error metric value, such as an error metric value (e.g., BER, column 510) indicating severity of error(s), e.g., as detected by error control module 125. In some embodiments, an entry 512 is added to error adjustment characteristics table 500 when a detected error metric value exceeds a threshold value. In some embodiments, error adjustment characteristics table 500 includes an error adjustment characteristic (not shown) indicating one or more adjustments that will be made to reduce error(s). Error adjustment characteristics table 500 additionally includes, in various embodiments, information about a cause of an error, such as "read disturb," "retention," etc.

FIG. 5B illustrates an error adjustment characteristics table 550 that includes an error count column 552. In some embodiments, an error count associated with a memory portion is used to determine whether to apply an error adjustment when performing a write to memory. For example, error adjustment is performed when an error count value is greater than 0. In some embodiments, the error count is incremented each time the first threshold value is exceeded when a memory request sequence (e.g., a write followed by a read) occurs for a memory portion identified in table 550. In some embodiments, the error count is decremented each time the first threshold value is not exceeded when a memory request sequence occurs for a memory portion identified in table 550. Error adjustment characteristics table 550 includes entries for multiple memory portions (e.g., entries with identifying information for multiple memory portions).

In some embodiments, error adjustment characteristics table 550 includes entries for all selectable portions 142 of storage device 130. In such embodiments, the information in each entry (e.g., an error count, a bit error rate, or the like) is used to determine whether a subsequent write operation to the corresponding memory portion is to be performed using an error adjustment characteristic. In some embodiments, error adjustment characteristics table 550 includes additional information described with regard to error adjustment characteristics table 500.

Figure 6A:
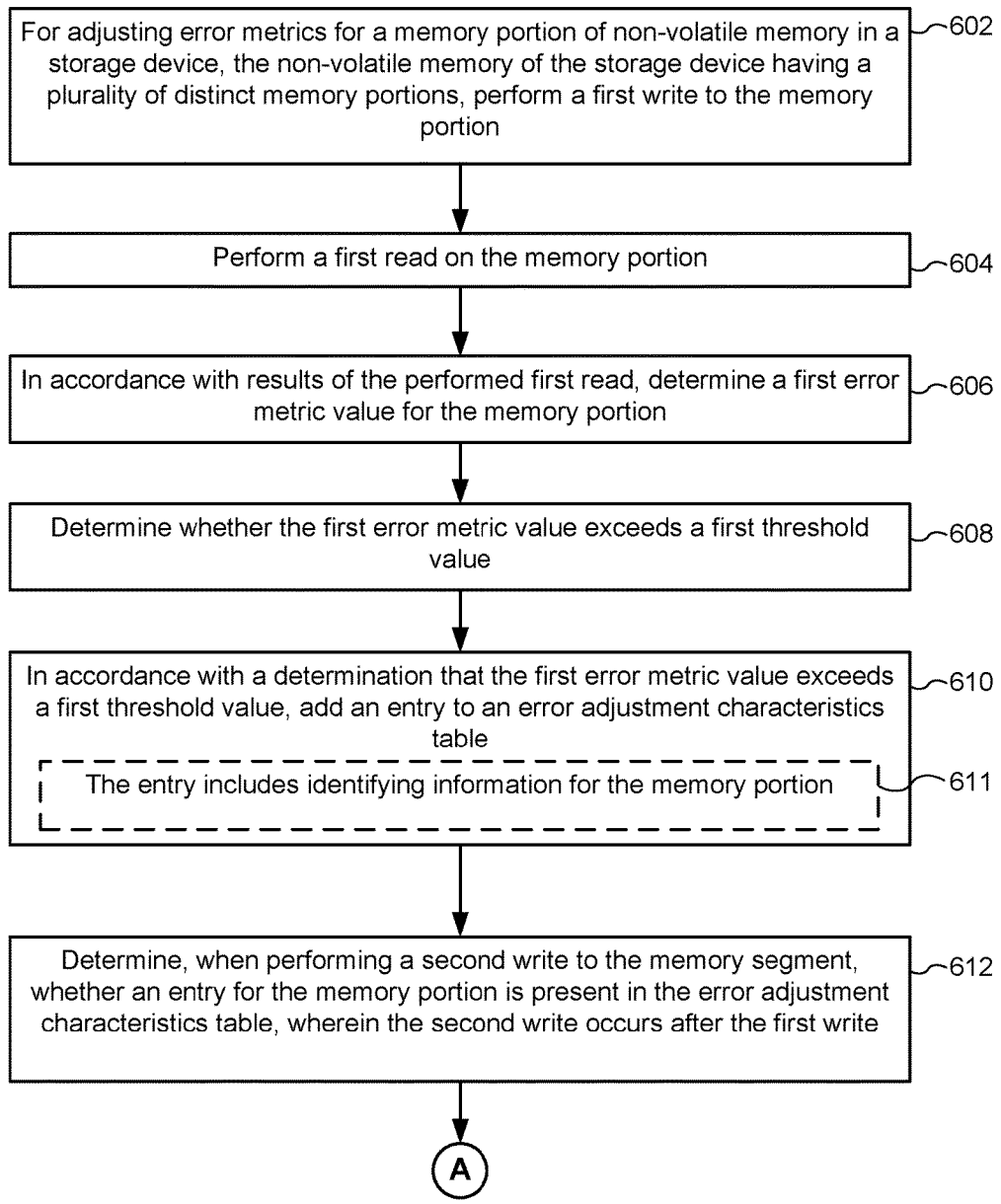
Figure 6B:
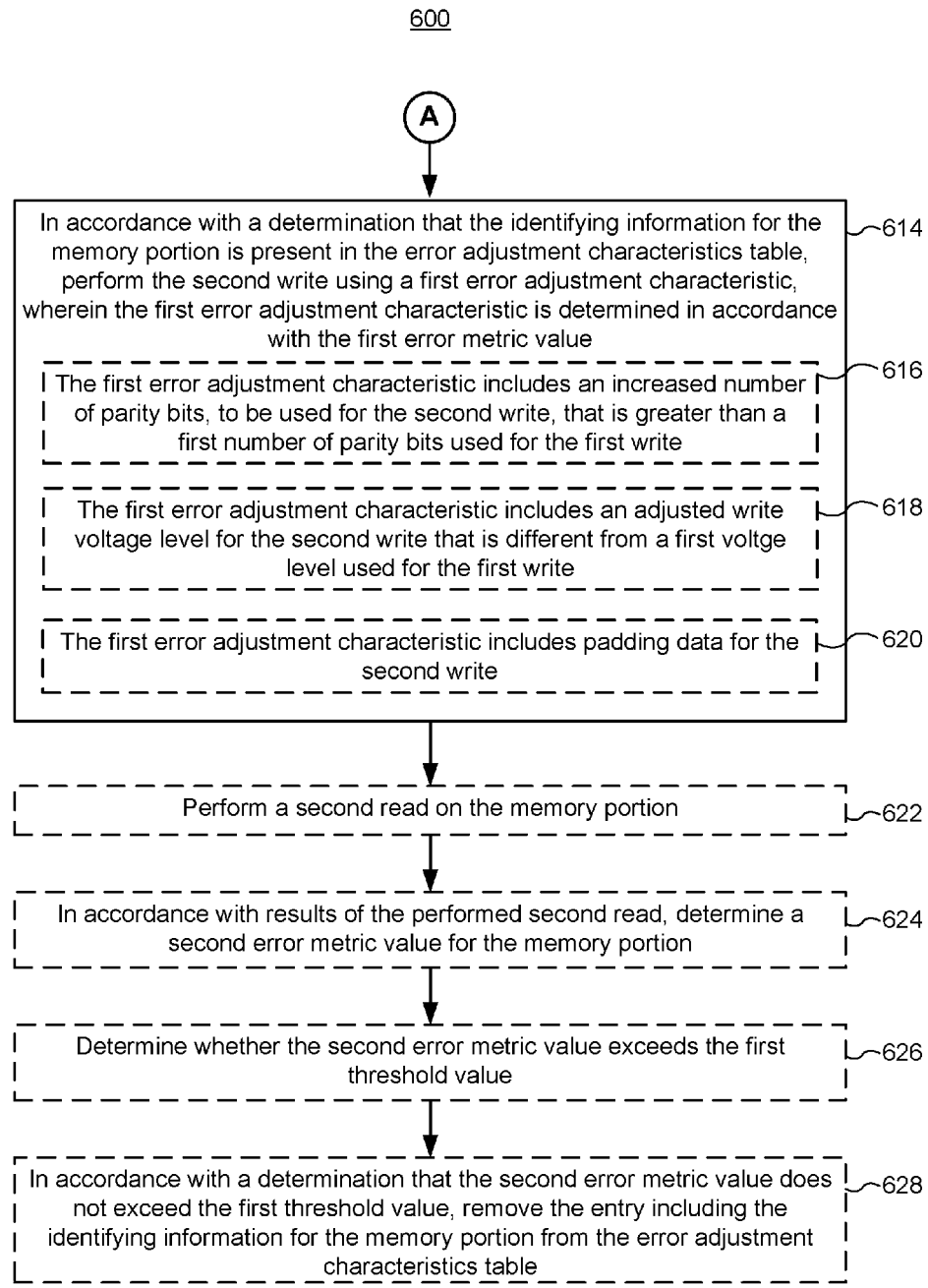

FIGS. 6A-6C illustrate a flowchart representation of a method 600 for adjusting error metrics for a memory portion of non-volatile memory in a storage device, in accordance with some embodiments. At least in some implementations, one or more steps of method 600 are performed by a storage device (e.g., storage device 120, FIG. 1) or one or more components of the storage device (e.g., storage controller 124, management module 121, error control module 125, and/or NVM controller 132, FIG. 1). For ease of explanation, "device" is used in the description of method 600 to refer to a storage device and components of the storage device. In some embodiments, method 600 is governed by instructions that are stored in a computer readable storage medium (e.g., a non-transitory computer readable storage medium) and that are executed by one or more processors of a device, such as the one or more processors 122 of management module 121 (FIG. 2) in storage controller 124, and/or the one or more processors of NVM controller 132 (not shown).

In some embodiments, the device performs (602) a first write (e.g., a write operation as described herein) to a memory portion (e.g., a selectable portion 142 of storage medium 130, FIG. 1).

The device performs (604) a first read (e.g., a read operation as described herein) on the memory portion 142. For example, the first read is an enhanced post-write read (EPWR) performed by the enhanced post-write read module 212. In some embodiments, an EPWR reads fewer bytes than the bytes read by a typical read operation. For example, typically, when 16 kilobytes are written as a result of a write operation, a read operation corresponding to the write operation (e.g., to read the same data that was written by the write operation) reads 16 kilobytes. An EPWR read operation reads, e.g., 4 kilobytes of the 16 kilobytes that were written.

In accordance with results of the performed first read, the device determines (606) a first error metric value (e.g., a BER) for the memory portion 142. In some embodiments, the first error metric value is a single value determined using one or more error measurements, such as an average of multiple types and/or iterations of error measurements.

The device determines (608) whether the first error metric value exceeds a first threshold value. In some embodiments, threshold criteria module 222 is used to determine whether the first metric value exceeds the first threshold value. In some embodiments, the first threshold value is a numerical value, such as 0.0091. In some embodiments, the first threshold value is determined (e.g., by threshold criteria module 222) based on whether the BER exceeds a correctable error correction value.

In accordance with a determination that the first error metric value exceeds the first threshold value, the device adds (610) an entry to error adjustment characteristics table 500. For example, referring to FIG. 5, a BER of 0.028 is determined for a memory portion corresponding to sector 3, word line 47 and block 307 of die 13. In accordance with a determination that the BER of 0.028 exceeds a threshold value, e.g., 0.0091, entry 512 is added (e.g., by error adjustment characteristics table module 218) to error adjustment characteristics table 500. In some embodiments, the entry added to the error adjustment characteristics table 500 includes identifying information (e.g., information identifying the die, block and word line, and optionally other identifying information such as sector) for the memory portion (611).

In some embodiments, error adjustment characteristics table 500 includes an error count field (not shown). When an entry (e.g., entry 512) is added to error adjustment characteristics table 500, a counter is set (e.g., to a value of 1). The counter is incremented each time the first threshold value is exceeded when memory request sequences (e.g., a write followed by a read) occur for the memory portion indicated by entry 512.

In some embodiments, scrubbing is enabled on the memory portion 142 in response to the determination that first error metric value exceeds first threshold value. Scrubbing includes reading from the memory portion, correcting bit errors (e.g., using an error-correcting code), and writing the corrected data to the memory portion. In some embodiments, scrubbing is performed by a scrubbing module (not shown) of memory 206.

In some embodiments, multiple types of first error metric values, such as two or more of: bit error rate, retention error rate, disturb induced error rate, temperature cross error rate (e.g., rate of errors due to temperature differences between when data was read and when data was written), defect induced error rate (e.g., rate of errors due to broken wordline and/or wordline-to-wordline short), etc., are determined (at 606) and the multiple types of first error metric values are compared to multiple first threshold values (at 608) to determine whether the memory portion will be added to the error adjustment characteristics table (at 610).

In some embodiments, the device determines (612), when performing a second write to the memory portion 142, whether an entry for the memory portion is present in the error adjustment characteristics table (e.g., error adjustment characteristics table 500). In some embodiments, this determination is made by determining whether identifying information for the memory portion is present in the error adjustment characteristics table. The second write to memory portion 142 occurs after the first write to memory portion 142. For example, when performing a second write to a memory portion at sector 3, word line 47, and block 307 of die 13, the device determines whether an entry with the identifying information (sector 3, word line 47, and block 307 of die 13) for the memory portion is present within error adjustment characteristics table 500.

In accordance with a determination that an entry for the memory portion 142 is present in the error adjustment characteristics table (e.g., error adjustment characteristics table 500), the device performs (614) the second write using a first error adjustment characteristic. The first error adjustment characteristic is determined (e.g., by error correction adjustment module 224) in accordance with the first error metric value. For example, the device determines that an entry with identifying information for memory portion 142 (e.g., sector 3, word line 47, and block 307 of die 13) is present in table 500 (e.g., at entry 502). As a result, the device uses an error adjustment characteristic when performing the second write.

In some embodiments, if error adjustment characteristics table 500 includes no entry for the memory portion to which the second write is directed, the device proceeds to perform the second write without using an error adjustment characteristic.

In some embodiments, rather than checking for the presence and/or absence of identifying information for the memory portion in error adjustment characteristics table 500 as indicated in FIG. 5A, the device uses an error adjustment characteristics table 550 as indicated in FIG. 5B. In some embodiments, error adjustment characteristics table 550 includes entries for all (or a subset of) selectable portions 142 of storage medium 130. For example, the device locates an entry including identifying information for the memory portion in table 550 and the device determines whether error count information for the entry (e.g., the information in column 552) indicates that error adjustment is needed (e.g., error adjustment is needed when the error count is equal or greater to a threshold value, such as 1).

In some embodiments, the first error adjustment characteristic includes (616) an increased number of parity bits, used for the second write, that is greater than a first number of parity bits used for the first write. In some embodiments, increasing the number of parity bits from the first write to the second write occurs in response to a determination that there is sufficient room for increasing the number of parity bits in the header of the data segment of the first write. In some embodiments, the first error adjustment characteristic includes increasing the ratio of parity bits to data bits, without changing the size of the codewords written to the storage medium. As a result, in such embodiments, each codeword occupies the same amount of storage space regardless of whether the first error adjustment characteristic is used while writing data to the storage medium, but the amount of data in each codeword varies in accordance with whether the first error adjustment characteristic is used while writing data to the storage medium.

In some embodiments, the first error adjustment characteristic includes (618) an adjusted write voltage level for the second write that is different from a first voltage level used for the first write. For example, a voltage used for writing to a bit-tuple of a memory cell, such as a voltage $V_0$, $V_1$, $V_{11}$, $V_{01}$, $V_{00}$, and/or $V_{10}$, as described with regard to FIGS. 3A-3B, is adjusted upward to a higher voltage level or downward to a lower voltage level. In some embodiments, adjusting the voltage level for the second write occurs in response to determining that a cell voltage distribution indicates that voltage adjustment is needed. For example, determining a first error metric value, as described with regard to 606 and/or determining a second error metric value, as described with regard to 624 below, includes determining that cell voltage drift has occurred.

In some embodiments, the first error adjustment characteristic includes (620) padding data for the second write. For example, the data of the second write is all 0s or a known pattern of 0s and 1s. In some embodiments, padding data is used in conjunction with an error adjustment characteristics table that includes an error count field (e.g., error count column 552 as indicated in error adjustment characteristics table 550 of FIG. 5B). For example, padding data is not used for the second write when an error count falls below a threshold (e.g., error count is less than 3) and padding data is used for the second write when the error count is greater than or equal to a threshold (e.g., error count is greater than or equal to 3).

In some embodiments, the first error characteristic includes reducing the number of bits used per cell. For example, a cell storage size is reduced from a triple level memory cell (TLC) that stores three bits per cell to a multi-level cell (MLC) that stores two bits per cell or a single-level cell (SLC) that stores one bits per cell. In another example, a cell storage size is reduced from MLC to SLC.

In some embodiments, the device performs a second read (622) on the memory portion. For example, the second read of the memory portion occurs after the first write, the first read, and the second write to the memory portion have occurred. The second read is, e.g., an EPWR performed by enhanced-post write read module 212. In some embodiments, the second read is used to determine whether an error adjustment characteristic that was used in the second write will still be needed for subsequent writes. For example, if a second error metric value determined from the second read indicates that the error adjustment will not be necessary, the memory portion is removed from the error characteristics adjustment table 500 (or an error count is decremented in error characteristics adjustment table 550) such that the error adjustment will not be applied on a subsequent write.

In some embodiments, in accordance with results of the performed second read, the device determines (624) a second error metric value (e.g., a BER) for the memory portion.

In some embodiments, the device determines (626) whether the second error metric value exceeds the first threshold value. In some embodiments, the second error metric value is a single value determined using one or more error measurements, such as an average of multiple types and/or iterations of error measurements.

In some embodiments, in accordance with a determination that the second error metric value does not exceed the first threshold value, the device removes (628) the entry including the identifying information for the memory portion 142 from the error adjustment characteristics table (e.g., error adjustment characteristics table 500). For example, in response to determining that a second error metric value (e.g., BER) does not exceed the first threshold value, the device removes from table 500 an entry (e.g., entry 512) that includes identifying information for the memory portion 142.

In some embodiments, in accordance with a determination that the second error metric value exceeds the first threshold value, the device does not remove the entry including the identifying information for the memory portion from the error adjustment characteristics table 500.

In some embodiments, in accordance with a determination that the second error metric value does not exceed the first threshold value, the device modifies an entry (e.g., an entry in table 550) that includes identifying information for the memory portion 142 by decrementing an error count (e.g., the value in column 502) for the entry.

In some embodiments, in accordance with a determination that the second error metric value exceeds the first threshold value, the device modifies an entry (e.g., an entry in table 550) that includes identifying information for the memory portion 142 by incrementing an error count (e.g., the value in column 502) for the entry.

In some embodiments, multiple types of second error metric values (e.g., bit error rate, retention error rate, etc.) are determined (at 624) and the multiple types of second error metric values are compared to multiple second threshold values (at 626) to determine whether the memory portion will be removed from the error adjustment characteristics table (at 628).

In some embodiments, the device determines (630) whether the first error metric value exceeds a second threshold value (e.g., an uncorrectable error correction value). In accordance with a determination that the first error metric value exceeds the second threshold value, the device writes the data of the first write to an alternative memory portion that is distinct from the memory portion 142 (e.g., instead of adding an entry to error adjustment characteristics table 500).

In some embodiments, the entry added to the error adjustment characteristics table 500 further includes the first error adjustment characteristic (e.g., information indicating or corresponding to an increased number of parity bits). In accordance with a determination that the second error metric exceeds the first threshold value, the device updates (632) the entry to replace the first error adjustment characteristic with a second error adjustment characteristic (e.g., an adjusted write voltage level). For example, error adjustment characteristics table 500 includes one or more additional columns to indicate a type (e.g., increased number of parity bits, adjusted write voltage level, padding data, or reducing number of bits used in the memory cell) and/or degree of error adjustment (e.g., number of additional parity bits, number of parity bits per codeword, value indicating amount of voltage adjustment, amount of reduction of number of bits used in the memory cell) to be applied during a write. In some embodiments, the second error adjustment characteristic is determined in accordance with the second error metric value.

In some embodiments, the entry added to the error adjustment characteristics table further includes the first error metric value (e.g., a BER value). For example, as shown in FIG. 5A, error adjustment characteristic table 500 includes column 504 indicating a BER for each entry. In accordance with a determination that the second error metric exceeds the first threshold value, the device updates (634) the entry to replace the first error metric value with the second error metric value.

In some embodiments, the storage device comprises (636) one or more three-dimensional (3D) memory devices and circuitry associated with operation of memory elements in the one or more 3D memory devices.

In some embodiments, the circuitry and one or more memory elements in a respective 3D memory device, of the one or more 3D memory devices, are (638) on the same substrate.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The semiconductor memory elements located within and/or over a substrate may be arranged in two or three dimensions, such as a two dimensional memory structure or a three dimensional memory structure.

The term "three-dimensional memory device" (or 3D memory device) is herein defined to mean a memory device having multiple memory layers or multiple levels (e.g., sometimes called multiple memory device levels) of memory elements, including any of the following: a memory device having a monolithic or non-monolithic 3D memory array; or two or more 2D and/or 3D memory devices, packaged together to form a stacked-chip memory device.

One of skill in the art will recognize that this invention is not limited to the two dimensional and three dimensional structures described but cover all relevant memory structures within the spirit and scope of the invention as described herein and as understood by one of skill in the art.

It will be understood that, although the terms "first," "second," etc. may be used herein to describe various elements, these elements should not be limited by these terms. These terms are only used to distinguish one element from another. For example, a first storage device could be termed a second storage device, and, similarly, a second storage device could be termed a first storage device, without changing the meaning of the description, so long as all occurrences of the "first storage device" are renamed consistently and all occurrences of the "second storage device" are renamed consistently. The first storage device and the second storage device are both storage devices, but they are not the same storage device.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method for adjusting error metrics for a memory portion of non-volatile memory in a storage device, the non-volatile memory of the storage device having a plurality of distinct memory portions, the method comprising:
   performing a first write to the memory portion;
   performing a first read on the memory portion;
   in accordance with results of the performed first read, determining a first error metric value for the memory portion;
   determining whether the first error metric value exceeds a first threshold value;
   in accordance with a determination that the first error metric value exceeds the first threshold value, adding an entry for the memory portion to an error adjustment characteristics table;
   determining, for a second write to the memory portion, whether an entry for the memory portion is present in the error adjustment characteristics table, wherein the second write occurs after the first write; and
   in accordance with a determination that the entry for the memory portion is present in the error adjustment characteristics table, performing the second write using a first error adjustment characteristic, wherein the first error adjustment characteristic is determined in accordance with the first error metric value.

2. The method of claim 1, wherein the entry added to the error adjustment characteristics table for the memory portion includes identifying information for the memory portion.

3. The method of claim 1, further comprising:
performing a second read on the memory portion;
in accordance with results of the performed second read, determining a second error metric value for the memory portion;
determining whether the second error metric value exceeds the first threshold value;
in accordance with a determination that the second error metric value does not exceed the first threshold value, removing the entry for the memory portion from the error adjustment characteristics table.

4. The method of claim 3, further comprising:
wherein the entry added to the error adjustment characteristics table includes the first error adjustment characteristic; and
in accordance with a determination that the second error metric exceeds the first threshold value, updating the entry to replace the first error adjustment characteristic with a second error adjustment characteristic.

5. The method of claim 3, further comprising:
wherein the entry added to the error adjustment characteristics table further includes the first error metric value;
in accordance with a determination that the second error metric exceeds the first threshold value, updating the entry to replace the first error metric value with the second error metric value.

6. The method of claim 1, further comprising:
determining whether the first error metric value exceeds a second threshold value; and,
in accordance with a determination that the first error metric value exceeds the second threshold value, write the data of the first write to an alternative memory portion that is distinct from the memory portion.

7. The method of claim 1, wherein the first error adjustment characteristic includes an increased number of parity bits, used for the second write, that is greater than a first number of parity bits used for the first write.

8. The method of claim 1, wherein the first error adjustment characteristic includes an adjusted write voltage level for the second write that is different from a first voltage level used for the first write.

9. The method of claim 1, wherein the first error adjustment characteristic includes padding data for the second write.

10. The method of claim 1, wherein the storage device comprises one or more three-dimensional (3D) memory devices and circuitry associated with operation of memory elements in the one or more 3D memory devices.

11. The method of claim 10, wherein the circuitry and one or more memory elements in a respective 3D memory device, of the one or more 3D memory devices, are on the same substrate.

12. A storage device, comprising:
a non-volatile memory, the non-volatile memory having a plurality of distinct memory portions;
one or more processors;
a memory storing one or more programs, which when executed by the one or more processors cause the storage device to:
perform a first write to the memory portion;
perform a first read on the memory portion;
in accordance with results of the performed first read, determine a first error metric value for the memory portion;
determine whether the first error metric value exceeds a first threshold value;
in accordance with a determination that the first error metric value exceeds the first threshold value, add an entry for the memory portion to an error adjustment characteristics table;
determine, for a second write to the memory portion, whether the entry for the memory portion is present in the error adjustment characteristics table, wherein the second write occurs after the first write; and
in accordance with a determination that the entry for the memory portion is present in the error adjustment characteristics table, performing the second write using a first error adjustment characteristic, wherein the first error adjustment characteristic is determined in accordance with the first error metric value.

13. The storage device of claim 12, wherein the one or more processors comprise one or more processors of a storage controller of the storage device, and the one or more programs include an error metrics determination module to determine the first error metric for the memory portion and determine whether the first error metric value exceeds a first threshold value, and an error correction adjustment module for adding or adjusting an error adjustment characteristic for the memory portion.

14. The storage device of claim 12, wherein the one or more programs, when executed by the one or more processors, further cause the storage device to:
perform a second read on the memory portion;
in accordance with results of the performed second read, determine a second error metric value for the memory portion;
determine whether the second error metric value exceeds the first threshold value;
in accordance with a determination that the second error metric value does not exceed the first threshold value, remove the entry for the memory portion from the error adjustment characteristics table.

15. The storage device of claim 14, wherein
the entry added to the error adjustment characteristics table includes the first error adjustment characteristic; and
the one or more programs, when executed by the one or more processors, further cause the storage device to update the entry to replace the first error adjustment characteristic with a second error adjustment characteristic in accordance with a determination that the second error metric exceeds the first threshold value.

16. The storage device of claim 14, wherein
the entry added to the error adjustment characteristics table further includes the first error metric value;
the one or more programs, when executed by the one or more processors, further cause the storage device to update the entry to replace the first error metric value with the second error metric value in accordance with a determination that the second error metric exceeds the first threshold value.

17. The storage device of claim 12, wherein the one or more programs, when executed by the one or more processors, further cause the storage device to:
determine whether the first error metric value exceeds a second threshold value; and,
in accordance with a determination that the first error metric value exceeds the second threshold value, write the data of the first write to an alternative memory portion that is distinct from the memory portion.

18. The storage device of claim 12, wherein the first error adjustment characteristic includes an increased number of parity bits, used for the second write, that is greater than a first number of parity bits used for the first write.

19. The storage device of claim 12, wherein the first error adjustment characteristic includes an adjusted write voltage level for the second write that is different from a first voltage level used for the first write.

20. The storage device of claim 12, wherein the first error adjustment characteristic includes padding data for the second write.

* * * * *